United States Patent
Nauchi et al.

(10) Patent No.: US 10,632,492 B2
(45) Date of Patent: Apr. 28, 2020

(54) FLUID DISCHARGE DEVICE, FLUID DISCHARGE METHOD, AND FLUID APPLICATION DEVICE

(71) Applicant: SENJU METAL INDUSTRY CO., LTD., Tokyo (JP)

(72) Inventors: Takashi Nauchi, Tokyo (JP); Hideki Nakamura, Tokyo (JP); Toshihiko Mutsuji, Tokyo (JP); Kazuya Kitazawa, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 15/543,155

(22) PCT Filed: Jan. 13, 2016

(86) PCT No.: PCT/JP2016/050757
§ 371 (c)(1),
(2) Date: Jul. 12, 2017

(87) PCT Pub. No.: WO2016/114275
PCT Pub. Date: Jul. 21, 2016

(65) Prior Publication Data
US 2018/0021803 A1 Jan. 25, 2018

(30) Foreign Application Priority Data

Jan. 13, 2015 (JP) .................................. 2015-003859
Jan. 13, 2015 (JP) .................................. 2015-003860

(51) Int. Cl.
*B05C 5/00* (2006.01)
*B05C 11/10* (2006.01)
(Continued)

(52) U.S. Cl.
CPC ................ *B05C 5/001* (2013.01); *B05C 5/00* (2013.01); *B05C 11/10* (2013.01); *B05D 1/26* (2013.01);
(Continued)

(58) Field of Classification Search
None
See application file for complete search history.

(56) References Cited

U.S. PATENT DOCUMENTS

| 4,898,117 A | 2/1990 | Ledermann et al. |
| 5,478,700 A | 12/1995 | Gaynes et al. |

(Continued)

FOREIGN PATENT DOCUMENTS

| JP | H02-015698 A | 1/1990 |
| JP | H07-202399 A | 8/1995 |

(Continued)

OTHER PUBLICATIONS

International Search Report (in English and Japanese) and Written Opinion of the International Searching Authority (in Japanese) issued in PCT/JP2016/050757, dated Apr. 12, 2016, ISA/JPO.

(Continued)

*Primary Examiner* — Jethro M. Pence
(74) *Attorney, Agent, or Firm* — Harness, Dickey & Pierce, P.L.C.

(57) ABSTRACT

A defect may occur in which as the amount of fluid discharged by a fluid discharge device decreases, a mask is not filled with the fluid even when the fluid is discharged. In order to fill a workpiece with the fluid, it is necessary to replace air in the workpiece corresponding to a discharge part with the fluid. The air in the workpiece is removed in advance, thereby filling the workpiece with the discharged fluid. A fluid discharge device in which, at one end of a discharge head, a suction port for sucking air in the mask on (Continued)

the workpiece, and a fluid discharge device having a discharge nozzle formed thereon for discharging the fluid are formed is used.

7 Claims, 2 Drawing Sheets

(51) Int. Cl.
*B05D 1/26* (2006.01)
*B23K 3/06* (2006.01)
*H01L 23/00* (2006.01)
*H05K 3/40* (2006.01)
*H05K 3/34* (2006.01)

(52) U.S. Cl.
CPC .............. *B23K 3/06* (2013.01); *H01L 24/11* (2013.01); *H01L 24/742* (2013.01); *H05K 3/34* (2013.01); *H05K 3/4007* (2013.01); *H01L 24/13* (2013.01); *H01L 2224/11001* (2013.01); *H01L 2224/11312* (2013.01); *H01L 2224/131* (2013.01); *H05K 2203/046* (2013.01); *H05K 2203/074* (2013.01); *H05K 2203/128* (2013.01)

(56) References Cited

U.S. PATENT DOCUMENTS

| | | | |
|---|---|---|---|
| 5,545,465 A | 8/1996 | Gaynes et al. | |
| 5,545,645 A | 8/1996 | Gaynes et al. | |
| 6,231,333 B1 | 5/2001 | Gruber et al. | |
| 6,253,957 B1 * | 7/2001 | Messerly | B05C 5/001 222/1 |
| 6,294,745 B1 | 9/2001 | Gruber | |
| 6,752,323 B1 * | 6/2004 | Roos | B05B 9/002 222/133 |
| 9,511,438 B2 | 12/2016 | Sato et al. | |
| 2001/0027842 A1 | 10/2001 | Curcio et al. | |
| 2003/0000084 A1 | 1/2003 | Bourrieres et al. | |
| 2006/0182887 A1 * | 8/2006 | Miller | B05C 5/001 427/256 |
| 2009/0123594 A1 | 5/2009 | Hein | |
| 2009/0183849 A1 | 7/2009 | Budd et al. | |
| 2014/0224860 A1 * | 8/2014 | Biggs | B23K 3/0607 228/33 |

FOREIGN PATENT DOCUMENTS

| | | |
|---|---|---|
| JP | 2003037360 A | 2/2003 |
| JP | 2005/152716 A | 6/2005 |
| JP | 2005-183542 A | 7/2005 |
| JP | 2007028377 A | 2/2007 |
| JP | 2007-268377 A | 10/2007 |
| JP | 2012-139627 A | 7/2012 |
| JP | 2013-098371 A | 5/2013 |
| JP | 2013098371 A | 5/2013 |
| TW | 200929483 A | 7/2009 |
| WO | WO2009/082062 A1 | 7/2009 |
| WO | WO-2013-058299 A1 | 4/2013 |
| WO | WO 2013/065470 A1 | 5/2013 |

OTHER PUBLICATIONS

Extended European Search Report dated Jun. 15, 2018 in corresponding European patent application No. EP 16737346.

* cited by examiner

FLUID DISCHARGE DEVICE, FLUID DISCHARGE METHOD, AND FLUID APPLICATION DEVICE

CROSS REFERENCE TO RELATED APPLICATIONS

This application is a U.S. National Phase Application under 35 U.S.C. 371 of International Application No. PCT/JP2016/050757 filed on Jan. 13, 2016 and published in Japanese as WO 2016/114275 A1 on Jul. 21, 2016, which is based on and claims the benefit of priority from Japanese Patent Application Nos. 2015-003859 and 2015-003860, both filed on Jan. 13, 2015. The entire disclosures of all of the above applications are incorporated herein by reference.

TECHNICAL FIELD

The present invention relates to a device that discharges a fluid, such as a molten solder or adhesive, onto a workpiece of an electronic component such as a substrate or a semiconductor.

BACKGROUND ART

A solder or adhesive is used for mounting electronic components, such as semiconductors, on a printed wiring board of an electronic device, and for assembly of electronic components such as semiconductors.

In particular, electronic components formed of ceramics or the like cannot be directly soldered. Accordingly, a pad consisting of a plate coating is provided on the surface of a workpiece of an electronic component, and a solder bump is formed on the pad. After that, soldering is performed through the bump.

Heretofore, a method using a solder paste has often been used as a solder bump forming method. After a solder paste is applied onto a plate coating of a workpiece by a printer or a dispenser, the solder paste is melted by reflow heating to thereby form a bump. This method is a low-cost method. However, printing has limitations on the range of available printing materials, and it is difficult to form a bump corresponding to a fine circuit pattern.

A bump forming method using a solder ball is also known. A fine solder ball is mounted on a workpiece of an electronic component, and the solder ball is reflow-heated to thereby form a bump. This method makes it possible to form a bump corresponding to a fine circuit pattern. However, the cost of the solder ball itself is high, which causes an increase in the overall cost.

As a method for forming a bump corresponding to a fine circuit pattern at a low cost, a so-called molten solder method of forming a solder bump by discharging a molten solder has attracted attention. In the molten solder method, a solder deposition device is known in which a molten solder is efficiently supplied to a plurality of sections by scanning the molten solder in the horizontal direction from a nozzle opening of a container containing the molten solder (Japanese Patent Laid-Open No. 2-015698).

Further, a bump forming device including a mechanism in which after completing an operation, a nozzle head is cooled, and the nozzle head is raised to separate from a mask is known (WO2013/058299A).

CITATION LIST

Patent Literature

Patent Literature 1: Japanese Patent Laid-Open No. 2-015698
Patent Literature 2: WO2013/058299A

SUMMARY OF INVENTION

Technical Problem

In the solder bump forming device using a molten solder and the fluid discharge device such as an adhesive application device, a mask as disclosed in Patent Literature 2 is generally used on a workpiece so as to control the amount of discharge onto a workpiece, such as a printed wiring board or a silicon wafer, to be small. A mask used during fluid discharge may be formed by forming a hole in plastics, such as a polyimide film, or in a sheet or plate made of metal, and the mask may be placed on a workpiece. Alternatively, the mask may be directly formed on a workpiece, such as a printed wiring board or a silicon wafer, using a resist. However, these devices have a problem that a defect that, as the discharge amount of fluid in the fluid discharge device decreases, the mask is not filled with the fluid even if the fluid is discharged, occurs. In particular, when the mask is formed with a large thickness so as to increase the height of the solder bump to be formed, such defects have occurred in many cases.

An object of the present invention is to achieve a fluid application device capable of completely filling a fluid in a mask for controlling a discharge amount even in the case of applying a fluid using a fine pattern.

Further, the solder bump forming device using the IMS method described above has a problem that drooling of a molten solder is caused after the formation of a solder bump. When the head is raised to separate from the workpiece and casual drooling or cobwebbing of an excess molten solder onto a workpiece is caused, an undesirable bridge may be formed.

On the other hand, the applicant has proposed an invention disclosed in Patent Literature 2 in which the head itself is forcedly cooled by a cooling unit before the head is raised, and the temperature of the molten solder in the head is decreased to a temperature at which drooling of fluid from the nozzle can be prevented even when the head is raised.

However, this technique has a drawback that it takes a lot of time. Specifically, it takes a long time to decrease the temperature of the molten solder, and it also takes a long time to increase the temperature of the molten solder for the subsequent operation. Therefore, when the processes of carrying in a workpiece of an electronic component, preheating the workpiece, heating a molten solder in a head, a solder bump forming operation, cooling the molten solder in the head, and carrying out the workpiece are cyclically performed, an increase in the time required for temperature control of the molten solder in the head is the greatest hindrance to the efficiency.

Accordingly, another object of the present invention is to provide rapid means for solving the problem of drooling of a molten solder.

Solution to Problem

The present inventors have found that an opening of a mask placed on a workpiece decreases as the discharge amount of fluid of the fluid discharge device decreases, which makes it difficult to fill a discharge part in the workpiece with the fluid; it is necessary to replace the air in the workpiece corresponding to the discharge part with the fluid so that the workpiece is filled with the fluid; and the workpiece is filled with the fluid discharged by removing the air in the workpiece in advance, and thus has completed the present invention.

The present invention provides a fluid discharge device for applying a fluid into a mask on a workpiece of an electronic component, the fluid discharge device including: a head part including a tank capable of accommodating a fluid, and a discharge head. One end of the discharge head is provided with a suction port for sucking air in the mask on the workpiece, and a discharge nozzle for discharging the fluid. The suction port is installed in an advancing direction of the discharge head. During preparation for fluid discharge, the discharge head moves closer to the workpiece until the discharge head contacts the workpiece, and during the fluid discharge, air in the mask is sucked from the suction port in a state where the discharge head is in contact with the workpiece, and then the fluid is discharged into the mask.

Further, in the fluid discharge method according to the present invention, the fluid is discharged, after air in a discharge part in the workpiece is removed, by using a fluid application device for applying a fluid onto a workpiece by discharging the fluid from a head, a suction port and a fluid discharge nozzle being provided at a tip of the head.

A dispenser is generally used as a fluid discharge device. The dispenser adds a pressure to the fluid to thereby discharge the fluid from an acicular needle. The discharge amount of the dispenser is determined by the diameter of the acicular needle and becomes smaller as the diameter of the needle decreases. However, when the diameter of a fluid to be discharged is smaller than 0.1 mm, like in the case of forming a bump onto a semiconductor silicon chip, an accurate amount of fluid cannot be discharged by the dispenser. For this reason, a method in which the discharge part in the workpiece is partitioned into small areas by a mask and a fluid is discharged onto the mask is employed. If a fluid is discharged without using a mask, the fluid spreads over a plane and contacts an adjacent electrode part. In the method disclosed in Patent Literature 2, the mask is formed with a small thickness because the fluid is discharged into a sealed space, and when the fluid is discharged under a condition in which the air in the mask is discharged, the fluid is replaced by the air, which makes it possible to discharge the fluid without causing any problem. However, if the thickness of the mask exceeds ½ of the diameter, the air cannot be discharged in the mask and the fluid to be discharged is not filled in the mask due to the air.

However, when the air in the mask to be discharged is removed immediately before filling the fluid, there is no need to replace the fluid by the air. As a result, the discharged fluid is directly filled in the discharge part in the mask, the fluid can be stably discharged without causing any defect in filling.

The present inventors have also found that the fluid discharge device, such as the solder bump forming device using the IMS method, discharges a fluid without cooling the head, and adjusts the pressure to be added to the fluid, thereby preventing leakage of an excess fluid from the nozzle, and that it is effective to switch a positive pressure and a negative pressure to achieve this, and thus have completed the present invention.

The present invention provides a fluid application device including: a discharge head that moves away from a workpiece; a heater unit for keeping a molten solder in a tank at a desired temperature; first pressure supply means for supplying a first pressure into the tank and ejecting the molten solder in the tank onto the workpiece from an opening of the nozzle; second pressure supply means for supplying a second pressure into the tank and holding the molten solder in the tank without ejecting the molten solder from the opening of the nozzle; a pressure sensor for monitoring the pressure in the tank; and a control device for controlling a pressure to be supplied into the tank based on a signal from the pressure sensor.

Advantageous Effects of Invention

The use of the fluid discharge device of the present invention makes it possible to obtain a stable fluid discharge even when the diameter of a fluid to be discharged is small and it is difficult to discharge the fluid using a dispenser. In particular, even when a mask having a thickness larger than the diameter of the fluid to be discharged is used because a solder with a large height is required, a small amount of fluid to be discharged can be discharged without causing any defect in filling. Therefore, a vast number of corrections to be made in the application of a fluid into a small mask in a workpiece of related art are eliminated, which leads to a significant improvement in productivity.

According to the present invention, the position of the discharge head containing the molten solder is detected, and when the position of the discharge head reaches a prescribed position, a positive-pressure-side valve and a negative-pressure-side valve are opened or closed, thereby changing the pressure to be supplied into the tank of the head to the positive pressure side or the negative pressure side. The pressure to be supplied into the tank is controlled based on the signal from the pressure sensor, while monitoring the pressure in the tank by the pressure sensor. When the discharge head containing the molten solder is moved to a prescribed position; the valve indicates a negative pressure side; an upward pressure is applied to the inside of the tank; and the discharge head reaches a prescribed position and a solder bump is formed on a workpiece, the valve is switched to a positive pressure side and a downward pressure is applied, thereby ejecting the molten solder from the nozzle opening. When the head is separated from the workpiece after the molten solder is discharged, the value is switched to the negative pressure side again to reliably hold the molten solder in the tank. This state switching can be reliably and rapidly performed by pressure control. Consequently, the problem of drooling of the molten solder can be reliably solved, and a lot of stand-by time caused by the molten solder cooling process in the cyclic process for solder bump formation of related art can be drastically reduced, and the productivity of the device can be considerably improved.

Note that also in the technique disclosed in Japanese Patent Laid-Open No. 2-015698 described above, the pressure to be supplied into the tank of the head is controlled to eject the molten solder from the nozzle or holding the molten solder in the tank, thereby maintaining the position of the solder. However, this pressure control is performed based on signals from two contact-type sensors. Therefore, this method is much inferior to the present invention in terms of swiftness of manipulation and action on the fluid.

DESCRIPTION OF EMBODIMENTS

First Embodiment

Figure 1:
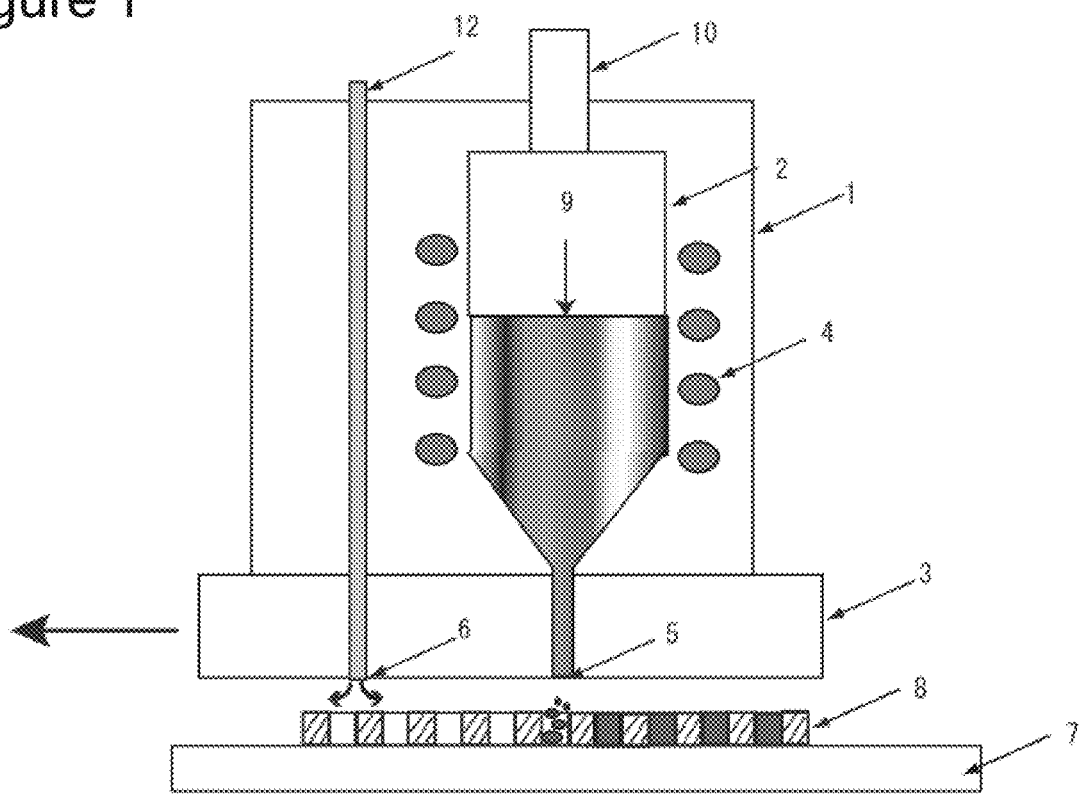
FIG. 1 is a schematic view illustrating a discharge state of a fluid application device according to the present invention.

First, the structure of a head part 1 of a fluid application device will be described. FIG. 1 is a diagram illustrating the head part 1 according to the present invention. The head part 1 includes a fluid tank 2 which is capable of containing a molten solder or the like, and a discharge head 3 which is provided at a lower end of the head part. When a fluid that requires temperature control, such as a molten solder, is used, heating means may be attached by, for example, winding a heater 4 around a body part of the fluid tank 2. The discharge head 3 includes a fluid discharge nozzle 5 and a suction port 6 which are provided at a lower end of the head. The suction port 6 is attached in such a manner that the suction process can be carried out in the advancing direction prior to that for the fluid discharge nozzle 5.

As the shape of the nozzle opening of the discharge head 3 according to the present invention, a circular shape, a slit-like shape, and other well-known shapes can be employed. In particular, when a slit-like shape is used as the shape of the nozzle opening, it is possible to discharge a fluid onto a plurality of workpieces at the same time.

Also, as the shape of the suction port 6 attached to the discharge head 3, a circular shape, a slit-like shape, and other well-known shapes can be employed. However, if a slit-like shape with a narrow width is used as the shape of the opening, it is possible to increase the suction force and reliably remove the air in the mask 8. The width of the slit in the present invention is desirably 0.1 to 20 mm.

Figure 2:
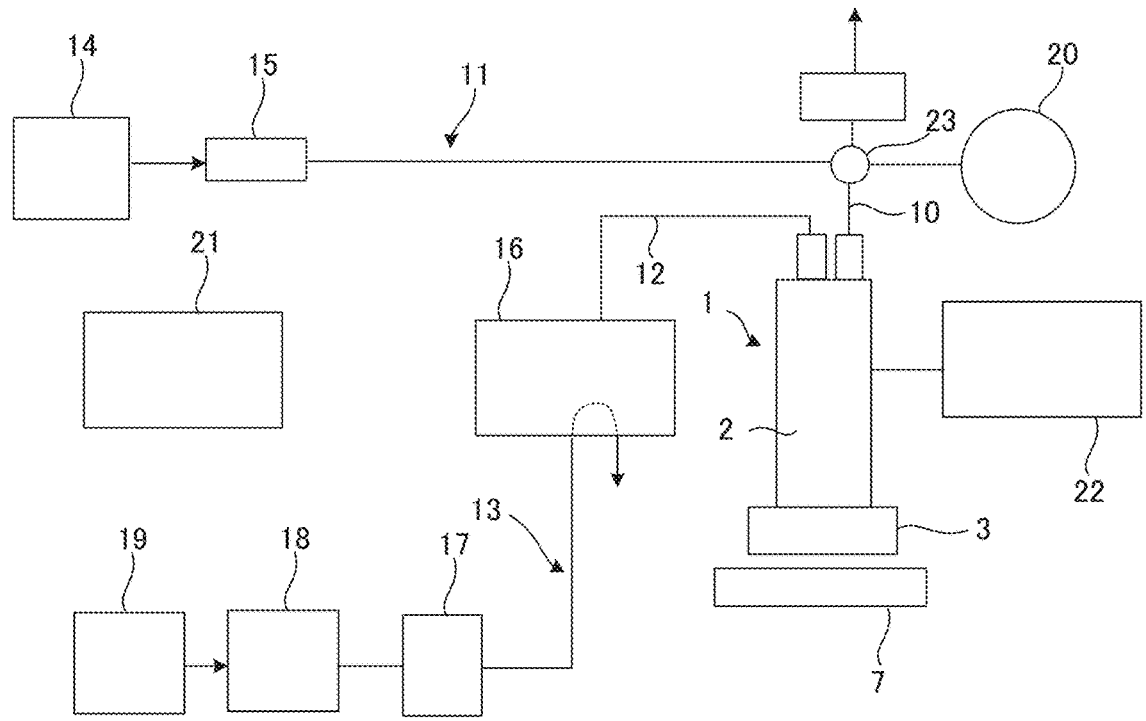
FIG. 2 is a schematic view illustrating a structure of one embodiment of the fluid application device according to the present invention.

Next, the overall structure will be described. As illustrated in FIG. 2, the fluid application device according to the present invention is movable in the vertical direction so as to be closer to or away from the workpiece 7 of the electronic component over which the fluid is applied, and is also movable in the horizontal direction. During fluid discharge, the discharge head 3 descends to a position where the fluid discharge nozzle 5 is in contact with the workpiece 7. The liquid discharge head 3 is horizontally moved while the contact state between the fluid discharge nozzle 5 and the workpiece 7 is maintained. During the horizontal movement of the liquid discharge head 3, the fluid is discharged from the opening of the fluid discharge nozzle 5, and the fluid is applied onto the workpiece 7. When the application of the fluid is completed, the liquid discharge head 3 is raised to separate from the workpiece 7.

The fluid discharge device 1 includes the heater 4 for keeping the fluid in the tank 2 at a desired temperature. The heater 4 can be incorporated in a wall part of the tank 2. The heater 4 is managed and controlled so that the fluid can be heated to an appropriate temperature for keeping an optimum viscosity for application conditions of the fluid 9 such as the molten solder in the tank 2.

Further, the heater 4 may be attached to a part corresponding to the discharge head 3 of the present invention. The attachment of the heater to the discharge head improves the liquidity of the fluid and prevents clogging of the fluid. Further, heating of the air in the mask for suction facilitates removal of the air.

The fluid discharge device 1 is connected to pressure supply means 11, which can establish fluid communication, from the tank 2 through an extension pipeline 10, and is connected to depressurization supply means 13, which can establish fluid communication, through a suction pipe extension pipeline 12 leading from the suction port 6.

The pressure supply means 11 includes a pressure generation source 14 that generates, for example, a nitrogen gas with a pressure of 0.06 to 0.1 MPa (not limited to this). The pressure generation source 14 supplies a pressure into the tank 2 through a gate valve 15 and a three-way valve 23. The molten solder held in the tank 2 receives a positive pressure from the pressure generation source 14 and is ejected from the opening of the fluid discharge nozzle 5.

The depressurization supply means 13 includes a microejector 16 which is a vacuum generation device. The vacuum generation device 16 is coupled to a pressure generation source 19, which generates a nitrogen gas with a pressure of 0.4 MPa (not limited to this), for example, through a regulator 17 and a throttle valve 18, and supplies a negative pressure to the suction port 6 through the suction pipe extension pipeline 12.

The fluid discharge device includes a pressure sensor 20 and a control device 21. The pressure sensor 20 is coupled to the three-way valve 23, which is provided at the extension pipeline 10 that communicates with the fluid in the tank 2, and monitors the pressure in the tank 2. A signal indicating the pressure in the tank 2 is sent from the pressure sensor 20 to the control device 21.

In accordance with the progress of the operation process, the control device 21 manipulates the pressure generation source 14, the vacuum generation device 16, the regulator 17, and the pressure generation source 19, and each value, and supplies a pressure into the tank 2. An appropriate value of a pressure to be supplied is determined based on the signal from the pressure sensor 20.

When the molten solder in the tank 2 is ejected from the opening of the fluid discharge nozzle 5, and is manipulated so that the fluid in the tank 2 communicates with the pressure sensor 20. The magnitude of the positive pressure to be supplied into the tank 2 can be changed by, for example, adjusting the pressure value generated in the pressure generation source 14 by the control device 21. Alternatively, the pressure value may be changed by adjusting an adjustment valve (not illustrated), which is provided on the pressure supply means 11, by the control device 21.

An appropriate value of a pressure to be supplied into the tank 2 for ejecting a fluid, such as a molten solder, from the opening of the fluid discharge nozzle 5, or holding the fluid in the tank 2 also depends on the amount (weight) of the molten solder contained in the tank 2. Accordingly, the control device 21 may be configured to input data related to the amount of the fluid in the tank 2. In this case, the control device 21 can calculate an appropriate tank internal pressure value for ejecting the fluid or holding the fluid in the tank, based on data indicating the amount of the fluid in the tank 2. Furthermore, the control device 21 can compare the appropriate tank internal pressure value with the actual tank internal pressure value indicated by the signal from the pressure sensor 20, and can adjust the pressure generation source 14 and each value so as to obtain the appropriate pressure in the tank.

To minimize a fluctuation in the appropriate tank internal pressure value due to a fluctuation in the amount of the fluid in the tank 2, a fluid supply device 22 may be coupled to the tank 2. When the molten solder in the tank 2 is consumed when the fluid discharge device is in operation, the fluid supply device 22 can automatically supply an additional fluid so that the amount of the fluid in the tank 2 is kept substantially constant.

Any well-known technique may also be used to recognize the amount of the fluid in the tank 2.

When the amount of the molten solder in the tank 2 can be estimated from, for example, the number of products that have been processed and the appropriate tank internal pressure value corresponding to the amount of the fluid in the tank can be recognized by experience, the control device 21 can control the pressure to be supplied into the tank 2 based only on the signal from the pressure sensor 20.

Lastly, an operation of the fluid discharge device according to the present invention will be described. The discharge head 3 according to the present invention is fixed to a fixed position away from the workpiece 7. However, during fluid discharge, the discharge head 3 is also moved in the vertical direction and the horizontal direction, and the discharge head 3 descends to a position in contact with the discharge part of the mask 8 on the workpiece 7. In the present invention, the discharge head 3 which is discharging the fluid 9 is always moved horizontally from the location where the suction nozzle 6 is installed, and the discharge head 3 is moved in such a manner that the air is depressurized from the opening of the mask 8 on the workpiece 7 and then the fluid is discharged from the discharge nozzle 5. The pressure supplied from the pressure generation source 14 is supplied into the tank 2 through the gate valve 15. The fluid 9 held in the tank 2 receives the pressure from the pressure generation source 14 and is ejected from the opening of the discharge nozzle 5. The discharge head 3 is horizontally moved above the mask 8 of the workpiece 7, and the application of the fluid in a predetermined range is completed.

Second Embodiment

Figure 3:
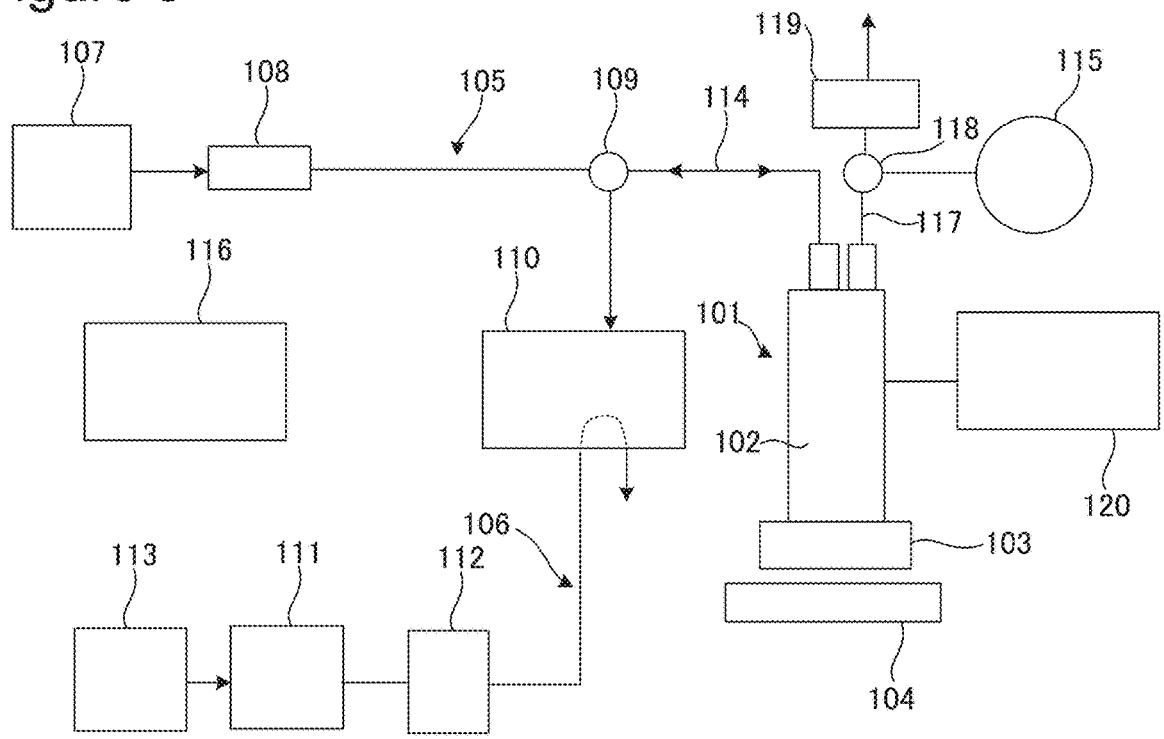
FIG. 3 is a schematic view illustrating a structure of one embodiment of the fluid application device according to the present invention.

As illustrated in FIG. 3 a fluid application device according to the present invention includes a discharge head 101. The discharge head 101 includes a tank 102 which is capable of containing a fluid (e.g., a molten solder, but not limited to this example), and a nozzle 103 which is provided at a lower end of the discharge head. A lower surface of the nozzle 103 is provided with an opening for ejecting the fluid in the tank 102. As the shape of the nozzle opening, a slit and other well-known shapes can be employed.

The entire discharge head 101 is movable in the vertical direction so as to be closer to or away from a workpiece 104 of the electronic component on which a coated portion (e.g., a solder bump) is to be formed, and is also movable in the horizontal direction. During formation of the coated portion, the discharge head 101 descends to a position where the nozzle 103 contacts the workpiece 104. The discharge head 101 is horizontally moved while the contact state between the nozzle 103 and the workpiece 104 is maintained. The fluid is ejected from the opening of the nozzle 103 during the horizontal movement of the discharge head 101 and the coated portion is formed on the workpiece 104. When the formation of the coated portion is completed, the discharge head 101 is raised to separate from the workpiece 104.

The fluid application device includes a heater unit (not illustrated) for holding the fluid in the tank 102 at a desired temperature. The heater unit can be built in a wall part of the discharge head. The heater unit is managed and controlled so that the fluid in the tank 102 is heated to an appropriate temperature for keeping an optimum viscosity for bump formation.

The fluid application device includes first pressure supply means 105 and second pressure supply means 106 which can establish fluid communication with the inside of the tank 102 of the discharge head 101.

The first pressure supply means 105 includes a pressure generation source (positive pressure supply source) 107 which generates a nitrogen gas with a pressure of, for example, 0.06 to 0.1 MPa (not limited to this). The positive pressure supply source 107 supplies a positive pressure into the tank 102 through a gate valve 108 and a three-way valve 109. The fluid held in the tank 102 receives the positive pressure from the positive pressure supply source 107 and is ejected from the opening of the nozzle 103.

The second pressure supply means 106 includes a micro ejector (negative pressure supply source) 110 which is a vacuum generation device. The negative pressure supply source 110 is coupled to a pressure generation source 113, which generates a nitrogen gas with a pressure of, for example, 0.4 MPa (not limited to this), through a regulator 111 and a throttle valve 112, and supplies a negative pressure into the tank 102 through the valve 109 and a common pipeline 114. The fluid to be ejected from the opening of the nozzle 103 receives the negative pressure from the negative pressure supply source 110 and is held in the tank 102 or the nozzle 103.

The fluid application device includes a pressure sensor 115 and a control device 116. The pressure sensor 115 is coupled to a three-way valve 118, which is provided at an extension pipeline 117 that communicates with the fluid in the tank 102, and monitors the pressure in the tank 102. A signal indicating the pressure in the tank 102 is sent from the pressure sensor 115 to the control device 116.

In accordance with the progress of the operation process, the control device 116 detects the position of the discharge head containing the molten solder. When the position of the discharge head reaches a prescribed position, the valve 109 opens the path 105; the positive pressure supply source 107, the negative pressure supply source 110, the regulator 111, and the pressure generation source 113, and each value are manipulated; and a pressure is supplied into the tank 102. An appropriate value of the pressure to be supplied is determined based on a signal from the pressure sensor 115.

When the fluid in the tank 102 is ejected from the opening of the nozzle 103, the valve 109 is manipulated so as to allow only the fluid communication between the first pressure supply means 105 and the common pipeline 114. The gate valve 108 is opened, and a gate valve 119 which is provided at the extension pipeline 117 is closed. The three-way valve 118 is manipulated so as to establish fluid communication between the inside of the tank 102 and the pressure sensor 115. The magnitude of the positive pressure to be supplied into the tank 102 can be changed by, for example, adjusting the pressure value generated in the positive pressure supply source 107 by the control device 116. Alternatively, the pressure value may be changed by adjusting an adjustment valve (not illustrated), which is provided on the first pressure supply means 105, by the control device 116.

When the fluid is not ejected from the opening of the nozzle 103 and the fluid is held in the tank 102 or the nozzle 103, for example, during the movement of the discharge head to the prescribed position, or when the discharge head is moved from above the mask after completion of the fluid discharge, the valve 109 is manipulated so as to allow only the fluid communication between the second pressure supply means 106 and the common pipeline 114. The negative pressure supply source 110 receives the pressure from the pressure generation source 113 through the regulator 111 and the throttle valve 112 and generates a negative pressure. The magnitude of the negative pressure to be supplied into the tank 102 is, for example, can be changed by adjusting the regulator 111 or the throttle valve 112 by the control device 116.

An appropriate value of a pressure to be supplied into the tank 102 for ejecting the fluid from the opening of the nozzle 103 or holding the fluid in the tank 102 also depends on the amount (weight) of the fluid contained in the tank 102. Accordingly, the control device 116 may be configured to input data related to the amount of the fluid in the tank 102. In this case, the control device 116 can calculate an appropriate tank internal pressure value for ejecting the fluid or holding the fluid in the tank, based on data on the amount of the fluid in the tank 102. Further, the control device 116 compares the appropriate tank internal pressure value with the actual tank internal pressure value indicated by the signal from the pressure sensor 115, and can adjust the positive pressure supply source 107 and each value so as to obtain the appropriate pressure in the tank.

To minimize a fluctuation in the appropriate tank internal pressure value due to a fluctuation in the amount of the fluid in the tank 102, a solder supply device may be coupled to the tank 102. When the fluid in the tank 102 is consumed when the fluid application device is in operation, a solder supply device 120 can automatically supply an additional solder so that the amount of the fluid in the tank 102 is kept substantially constant.

Any well-known technique may also be used to recognize the amount of the fluid in the tank 102.

When the amount of the fluid in the tank 102 can be estimated from, for example, the number of products that have been processed and the appropriate tank internal pressure value corresponding to the amount of the fluid in the tank can be recognized by experience, the control device 116 can control the pressure to be supplied into the tank 102 based only on the signal from the pressure sensor 115.

Next, an operation of the fluid discharge device according to the second embodiment of the present invention will be described. The discharge head 101 according to the present invention is fixed to a fixed position away from the workpiece 104. During movement of the discharge head 101, the valve 109 opens a path leading to the second pressure supply means 106.

During fluid discharge of the discharge head 101, the discharge head 101 is moved in the vertical direction and the horizontal direction, and the discharge head 101 descends to a position in contact with the discharge part of the mask on the workpiece 104. When the discharge head 101 is moved away from the discharge part of the mask on the workpiece 104 and reaches a prescribed position which is immediately movable to the discharge part of the mask, the valve 109 is switched and a path leading to the first pressure supply means 105 is opened. In the present invention, the discharge head 101 which is discharging the fluid is always moved horizontally from the location where the suction nozzle is installed, and the discharge head 101 is moved in such a manner that the air is depressurized from the opening of the mask on the workpiece 104 and then the fluid is discharged from the discharge nozzle 103. The pressure supplied from the pressure generation source 107 is supplied into the tank 102 through the gate valve 108. The fluid held in the tank 102 receives the pressure from the pressure generation source 107 and is ejected from the opening of the discharge nozzle 103. The discharge head 101 is horizontally moved above the mask of the workpiece 104, and the application of the fluid in a predetermined range is completed.

When the discharge head 101 is moved above the mask and reaches the prescribed position, the valve 109 is switched to a path leading to the second pressure supply means 106 this time. The pressure to be added to the discharge head 103 is switched to a negative pressure, and the solder is raised upward, thereby preventing leakage of the solder.

Figure 4:
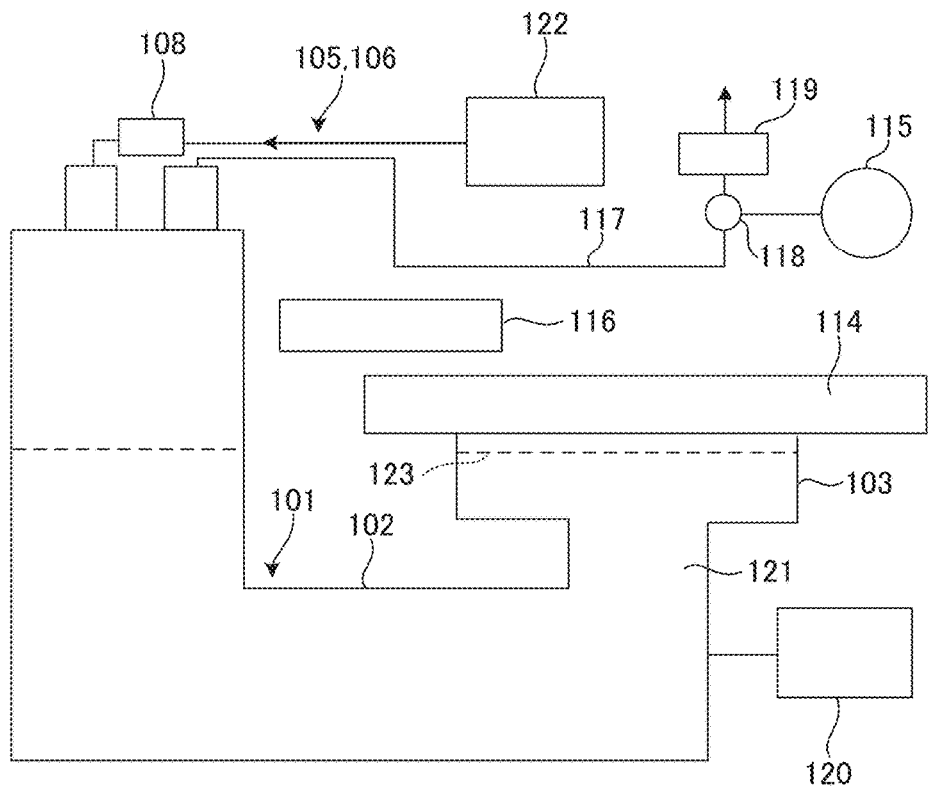
FIG. 4 is a side schematic view illustrating a discharge head of another embodiment of the fluid application device according to the present invention.

FIG. 4 illustrates another embodiment of the fluid application device according to the present invention. FIG. 4 differs from FIG. 3 in that FIG. 3 illustrates that the nozzle 103 of the injection 101 is configured to be positioned above the workpiece 104, while FIG. 4 illustrates that the nozzle 103 is positioned below the workpiece 104. The entire shape of the discharge head 101 illustrated in FIG. 3 is an "I" shape, while FIG. 4 illustrates a "U"-shaped communication pipe.

A first feature of the embodiment illustrated in FIG. 4 is that the nozzle 103 is disposed below the workpiece 104, and thus the embodiment is free from the problem of drooling of the fluid from the nozzle 103 onto the workpiece 104.

A second feature is that when a fluid 121 is to be held in the tank 102, the weight of the fluid 121 itself can be used, which eliminates the need for a negative pressure supply source. To eject the fluid 121 from the opening of the nozzle 103 or hold the fluid in the tank 102, the embodiment illustrated in FIG. 3 requires the first pressure supply means 105 including the positive pressure supply source 107 and the second pressure supply means 106 including the negative pressure supply source 110, while in the embodiment illustrated in FIG. 4, the first pressure supply means 105 and the second pressure supply means 106 can include a common positive pressure supply source 122. In other words, the embodiment illustrated in FIG. 4 may include only a single pressure supply means including one positive pressure supply source 122.

FIG. 4 illustrates a state where a fluid level 123 of the fluid in the nozzle 103 in the tank 102, which is in an atmospheric pressure state, is positioned slightly below an upper end of the nozzle 103. During formation of the coated portion, the gate valve 108 is opened and the positive pressure supply source 122 supplies a pressure having an appropriate value into the tank 102. The fluid 121 is ejected from the opening of the nozzle 103, and the coated portion is formed on the workpiece 104. After completion of the operation, the gate valve 108 is closed and the gate valve 119 is opened so that the pressure in the tank 102 is returned to the atmospheric pressure and the fluid 121 is held in the tank 102 by the weight of the fluid itself.

In a case where the fluid 121 in the tank 102 is consumed and the fluid level 123 of the fluid in the head 103 decreases when the internal pressure of the tank 102 is in the atmospheric pressure state, a positive pressure is supplied into the tank 102 even in an operation stand-by state, so that the fluid level 123 can be kept at the position illustrated in FIG. 4.

The amount of solder corresponding to the amount of the consumed fluid may be automatically supplied into the tank 102 by using the solder supply device 120 so that the amount of the fluid 121 in the tank 102 is substantially constant and the fluid level 123 of the fluid in the head 103 when the internal pressure of the tank 102 is the atmospheric pressure is maintained at a substantially constant height.

Also in the embodiment illustrated in FIG. 4, the pressure to be supplied into the tank 102 is controlled by the control device 116 based on the signal from the pressure sensor 115.

All pieces of data necessary for controlling the pressure to be supplied into the tank 102, such as the amount of the fluid in the tank 102, are input to the control device 116.

REFERENCE SIGNS LIST

1 Head part
2 Tank
3 Discharge head
4 Heater
5 Discharge nozzle
6 Suction port
7 Workpiece
8 Mask
9 Fluid
10 Extension pipeline
11 Pressure supply means
12 Suction pipe extension pipeline
13 Depressurization supply means
14 Pressure generation source
15 Gate valve
16 Vacuum generation device
17 Regulator
18 Throttle valve
19 Pressure generation source
20 Pressure sensor
21 Control device
22 Fluid supply device
101 Discharge head
102 Tank
103 Nozzle
104 Workpiece
105 First pressure supply means
106 Second pressure supply means
107 Pressure generation source (positive pressure supply source)
108 Gate valve
109 Valve
110 Micro ejector (negative pressure supply source)
111 Regulator
112 Throttle valve
113 Pressure generation source
114 Common pipeline
115 Pressure sensor
116 Control device
117 Extension pipeline
118 Three-way valve
119 Gate valve
120 Solder supply device
121 Fluid
122 Positive pressure supply source
123 Fluid level of fluid

The invention claimed is:

1. A fluid application device for forming a coated portion on a workpiece of an electronic component, the fluid application device comprising:
a discharge head including a tank capable of accommodating a molten solder, and a nozzle formed at one end of the discharge head, the discharge head being configured to be positioned above the workpiece, the discharge head being configured in such a manner that the discharge head moves closer to the workpiece until the nozzle contacts the workpiece during preparation for formation of the coated portion; the discharge head moves horizontally with respect to the workpiece while ejecting the molten solder in the tank from the nozzle in a state where the nozzle is in contact with the workpiece during formation of the coated portion; and the discharge head moves away from the workpiece after the formation of the coated portion is completed and the ejection of the molten solder from the nozzle is stopped;
a heater for keeping the molten solder in the tank at a desired temperature;
first pressure supply means for supplying a first pressure into the tank and ejecting the molten solder in the tank onto the workpiece from an opening of the nozzle;
second pressure supply means for supplying a second pressure into the tank and holding the molten solder in the tank without ejecting the molten solder from the opening of the nozzle;
a pressure sensor for monitoring the pressure in the tank;
a controller configured to control a pressure to be supplied into the tank based on a signal from the pressure sensor; and
a solder supply configured to supply an additional solder into the tank so that the amount of the molten solder in the tank is kept constant when the molten solder in the tank is consumed during operation,
wherein the solder supply is apart from the tank, and
wherein both the first pressure supply means and the second pressure supply means are connected to the tank via a single common pipeline, and
wherein a single valve controls fluid communiction through the single common pipeline that is shared by both the first and second pressure supply means, and the single valve is configured to switch between: (1) a state allowing fluid communication through the single common pipeline between only the first pressure supply means and the tank to provide the tank with the first pressure through the single common pipeline, and (2) a state allowing fluid communication through the single common pipeline between only the second pressure supply means and the tank to provide the tank with the second pressure through the single common pipeline.

2. The fluid application device according to claim 1, wherein
the discharge head is configured to position the nozzle above the workpiece,
the first pressure is a positive pressure,
the second pressure is a negative pressure,
the first pressure supply means includes a positive pressure supply source, and
the second pressure supply means includes a negative pressure supply source.

3. The fluid application device according to claim 2, wherein the controller is configured to input data related to an amount of the fluid in the tank.

4. The fluid application device according to claim 1, wherein
the discharge head is configured to position the nozzle below the workpiece,
the first pressure is a positive pressure,
the second pressure is an atmospheric pressure or a positive pressure, and
the first pressure supply means and the second pressure supply means include a common positive pressure supply source.

5. The fluid application device according to claim 4, wherein the controller is configured to input data related to an amount of fluid in the tank.

6. The fluid application device according to claim 5, further comprising a solder supply for supplying an additional solder into the tank when the fluid application device is in operation.

7. The fluid application device according to claim 1, wherein the controller is configured to detect a position of the discharge head and control the first pressure supply means to supply the first pressure into the tank of the discharge head when the discharge head descends toward the workpiece and reaches a prescribed position.

* * * * *